(12) United States Patent
Vukovic et al.

(10) Patent No.: US 11,967,684 B2
(45) Date of Patent: Apr. 23, 2024

(54) OUTDOOR RADIO UNITS WITH INTEGRATED SOLAR CELLS

(71) Applicant: Telefonaktiebolaget LM Ericsson (publ), Stockholm (SE)

(72) Inventors: Mirjana Vukovic, Ottawa (CA); David Pell, Carp (CA)

(73) Assignee: TELEFONAKTIEBOLAGET LM ERICSSON (PUBL), Stockholm (SE)

( * ) Notice: Subject to any disclaimer, the term of this patent is extended or adjusted under 35 U.S.C. 154(b) by 846 days.

(21) Appl. No.: 16/982,257

(22) PCT Filed: May 3, 2018

(86) PCT No.: PCT/IB2018/053095
§ 371 (c)(1),
(2) Date: Sep. 18, 2020

(87) PCT Pub. No.: WO2019/211652
PCT Pub. Date: Nov. 7, 2019

(65) Prior Publication Data
US 2021/0050632 A1 Feb. 18, 2021

(51) Int. Cl.
| | |
|---|---|
| *H04B 1/03* | (2006.01) |
| *H01M 10/46* | (2006.01) |
| *H02J 7/35* | (2006.01) |
| *H04B 1/40* | (2015.01) |
| *H05K 7/20* | (2006.01) |
| *H01L 31/046* | (2014.01) |

(52) U.S. Cl.
CPC ............ *H01M 10/465* (2013.01); *H02J 7/35* (2013.01); *H04B 1/40* (2013.01); *H05K 7/20145* (2013.01); *H05K 7/20154* (2013.01); *H01L 31/046* (2014.12); *H01M 2220/10* (2013.01)

(58) Field of Classification Search
CPC .. H04B 1/03; H04B 1/036; H04B 1/40; H02J 7/35; H01M 10/465; H01M 2220/10; H01M 10/44; H01M 10/46; H01L 31/046
See application file for complete search history.

(56) References Cited

U.S. PATENT DOCUMENTS

| | | | |
|---|---|---|---|
| 9,155,228 B2 | 10/2015 | Hill | |
| 9,800,084 B2 | 10/2017 | Rybkiewicz | |
| 10,612,753 B2 * | 4/2020 | Clynne | ........... F21V 15/01 |
| 2008/0023067 A1 | 1/2008 | Hu et al. | |
| 2010/0155575 A1 | 6/2010 | Lundin | |

(Continued)

FOREIGN PATENT DOCUMENTS

| | | |
|---|---|---|
| CN | 102155359 A * | 8/2011 |
| CN | 203851252 U | 9/2014 |

(Continued)

*Primary Examiner* — Blane J Jackson
(74) *Attorney, Agent, or Firm* — COATS & BENNETT, PLLC

(57) ABSTRACT

A radio unit for a cellular radio access network comprises electronic circuits including a cellular transceiver, a housing enclosing the transceiver circuit, and one or more flexible, thin-film solar cells or folia integrated with the housing or sprayed onto housing to convert solar radiation into electrical energy. The one or more area of solar cells can be used to provide power to the transceiver circuit or cooling fans to offset power consumption from the power gird.

13 Claims, 9 Drawing Sheets

(56) References Cited

U.S. PATENT DOCUMENTS

| | | | |
|---|---|---|---|
| 2011/0297351 A1 | 12/2011 | Vosper et al. | |
| 2012/0048343 A1* | 3/2012 | Chang | H01M 10/465 |
| | | | 136/251 |
| 2013/0299125 A1 | 11/2013 | Shi et al. | |
| 2013/0342153 A1 | 12/2013 | Jun et al. | |
| 2014/0211487 A1* | 7/2014 | Spiro | F21V 29/74 |
| | | | 362/382 |
| 2018/0045388 A1* | 2/2018 | McDowell | F21V 29/15 |
| 2018/0316086 A1* | 11/2018 | Lehman | H04W 76/40 |

FOREIGN PATENT DOCUMENTS

| | | | | |
|---|---|---|---|---|
| CN | 205509324 U | | 8/2016 | |
| CN | 205811299 U | | 12/2016 | |
| CN | 107894054 A | | 4/2018 | |
| EP | 3032750 A1 | | 6/2016 | |
| JP | 2016157810 A | * | 9/2016 | |
| JP | 2018051893 A | * | 4/2018 | C07D 487/14 |
| WO | WO-0152447 A3 | * | 5/2002 | G01S 19/11 |

\* cited by examiner

OUTDOOR RADIO UNITS WITH INTEGRATED SOLAR CELLS

TECHNICAL FIELD

The present disclosure relates generally to outdoor radio units used in wireless communication networks and, more particularly, to outdoor radio units including integrated solar cells for offsetting energy consumption of the radio unit.

BACKGROUND

Wireless networks often consist of medium to high power electronics enclosed in an environmentally hardened electronic unit which may be deployed outdoor, for example, at the top of a roof, a poll/masthead or tower near an antenna. More than a few highly or fully integrated digital and analog printed circuit packs with radio frequency (RF) transceivers, RF power amplifiers, power converters and multiple antennas are housed within the electronics unit. The electronics unit may be known as a remote radio unit (RRU), a remote base transceiver station (BTS), an antenna integrated radio (AIR) or integrated Active Antenna System (AAS) for 3G, 4G and upcoming 5G wireless services. Such units are referred to herein generically as radio units.

A radio unit (small or large) requires reliable power sources of alternating current/direct current (AC/DC) electrical power and the lack of quality in the electrical supply impacts the quality of the communication network in many places. It is known that in some communities around the world, with no reliable electrical sources, some alternative generators of electricity or battery back-up close to wireless base station are required to provide power of up to a few kilowatts. The power supplied to the radio unit in most cases comes from conventional power supplied by the utility power grid, or in some cases, from alternate sources such as "wind turbines" or "solar panel farms" that are physically separated and not directly connected to the radio units, but rather to the utility power grid.

Current trends in radio unit design are reducing power consumption of the radio units, deploying higher levels of electronic component integration, improving power efficiency and use of software controlled "sleep energy saving" modes. Even with these improvements in radio unit efficiency, it is difficult to meet the goal of reaching the system capacity while decreasing the carbon footprint.

Conventional outdoor radio units are designed to reflect direct solar radiation. The radio unit typically comprises a hardened metal enclosure with plastic covers/shields over an electronic unit painted a color for low absorptivity for the purpose of reflecting direct solar radiation. Although protected from direct radiation by a "solar shield", the radio unit still absorbs up to 20% of the solar load. The influence of direct solar heating on the electronics within the housing is accounts for up to +5° C. on top of the ambient temperature, resulting in a need to improve the electronic enclosure thermal management by increasing heat sink surface to be sufficient for cooling of electronics above 50° C.

Another drawback of current radio unit design is that they are entirely dependent on external power sources to provide power needed for operation. Power for the radio unit is typically drawn from the utility power grid. It would be desirable to reduce the amount of power taken from the power grid to reduce cost of operation. The prior art for harvesting solar energy/power relies on solar systems that are located far away and cannot be installed in close proximity to the radio unit. These solar systems typically comprise heavy-weight and robust solar panels that are physically separated from the radio units. Customers perceive these solar panels as part of the power grid, not part of the wireless communication equipment, and thus do not like to install them at the mastheads.

Conventional techniques for thermal management of outdoor radio units propose that the physical package of the enclosure provide passive, natural convection (without fans) for all internal components through use of one or more heat sinks, made of aluminum or die-cast material. The internally generated heat is due to non-efficiency of high thermal flux components such as the RF power amplifiers, transceivers, and power converters mounted on individual circuit boards. These units can generate a lot of heat that needs to be removed. In very hot climates, during hot diurnal cycle "full sun hours" or "peak sun hours," such electronic units cannot operate at full RF power and thus go into a back-off mode during "peak sun hours". In some cases, fan cooling is needed across those heatsinks to battle high heat fluxes of the unit.

When the radio unit is generating heat and is exposed to a hot climate, there are essentially two options for keeping the radio unit cool: 1) running the radio unit in a back-off mode (lower RF output power) during peak sun hours when it is very hot; or 2) deploying fans to create artificial wind over a heatsink (forced convection cooling). If fans are used for cooling, additional energy is drawn from the power grid that powers these fans and represents another drawback.

SUMMARY

The present disclosure relates to a radio unit for use in a cellular radio access network that uses thin-film solar cells integrated into the housing, shield or aesthetic cover to offset electrical power drawn from the power grid or other external sources. The radio unit is adapted to be mounted in a location exposed to an uncontrolled outdoor environment and solar radiation. Selected areas on the outer surface of the electronic enclosure or housing are covered with a light-weight, thin-film silicon-based solar cells or organic polymer film. Advanced technology thin-film solar cells (fourth generation) or polymer film may be attached or glued to the housing or sprayed over selected areas of the enclosure or housing (including any aesthetic covers). During daylight hours, the enclosure or housing will be exposed to daylight, not just sunlight. Solar cells use the energy from daylight, as opposed to sunlight, to produce electricity so solar cells do not need direct sunlight to work. It is photons in natural daylight which is converted by solar cells to produce electricity. A large amount of photons can be absorbed and converted with solar cells to electrical power, even from a relatively small area. It is true that direct sunlight does provide the best conditions for the harvesting of daylight energy. However, even in overcast conditions, light will diffuse through the clouds and reach the solar cells. The thin-film solar cells form an integral part of the enclosure or housing, which may enclose the electronic circuits, heatsink and/or antenna.

According to one aspect of the disclosure, the purpose of the thin-film solar cells is to absorb solar energy and convert it into electrical energy to offset power consumption of the radio unit. The thin-film photovoltaic solar cells may comprise silicon-based solar cells or non-metal organic polymer solar cells (metal element-free organic dye sensitizers to avoid obstructing RF signal). It is estimated that initially 10% of the overall unit's power consumption can be offset (estimations scale with size and form factor of a unit), but with future advances this could reach higher utilization. While silicon-based solar cells are currently more efficient at converting light energy into electrical energy, organic solar cells have the potential to exhibit RF transparency when applied to plastic covers or shields over RF antennas.

According to another aspect of the disclosure, the solar energy generated by the thin-film solar cells can be used to offset power consumption required for cooling fan operation. Radio units for outside communications equipment are required to operate over a wide range of weather conditions and temperatures in uncontrolled environments. Depending on the climate, ambient temperatures may range from −40° C. to +50° C. An outdoor environment with high solar radiation imposes challenges for thermal management of such unit/enclosure in any climate, but especially warm climate. The fans powered by the solar cells can generate an "artificial wind" or "breeze" around the enclosure or heat-sink to improve thermal cooling by introducing mixed or even forced air flow versus natural convection. In such way, the radio units can maintain full operational performance during "peak sun hours" without going into the back-off mode. It is estimated that the improvement in thermal cooling could lower the junction temperature of high flux devices up to 10° C. when the external ambient temperature is above 45-46° C. For a high power radio unit such as an AIR and AAS, where fans may be designed as an integral part of the radio unit and have to run continuously during peak hours, the use of solar cells can be coupled with the use of a battery. During the daylight time, the solar cells will provide necessary power for fan operation as well as charge the battery, if required to support continuous cooling during night time—this energy will need to equal or exceed the power used in a 24-hour day for the system to run independent of other power sources.

According to one aspect of the disclosure, the radio unit comprises electronic circuits including a cellular transceiver circuit, a housing enclosing the electronic circuits, and one or more flexible, thin-film solar cells seamlessly integrated within the housing to convert solar radiation into electrical energy.

In some embodiments, the radio unit further comprises a power circuit configured to power the transceiver circuit using direct solar energy generated by the flexible, thin-film solar cells. In one embodiment, the power circuit includes a battery for storing energy generated by the flexible, thin-film solar cells, and wherein the energy stored by the battery is used to power the electronic circuits.

In some embodiments, the radio unit further comprises a heat sink having a plurality of fins for dissipating heat from the radio unit, wherein the one or more fans are arranged to generate an air flow across the fins of the heat sink. In one embodiment, the housing comprises a cover configured to shield the heat sink from solar radiation and form an air flow channel, and wherein the solar cells are integrated with the cover. In another embodiments, one or more fans are attached to the cover.

In some embodiments, the radio unit further comprises one or more antennas or antenna elements enclosed within said housing. In one embodiment, the flexible, thin-film solar cells are arranged on the housing to avoid blocking radio frequency (RF) signals transmitted and received by the one or more antennas or antenna elements. In another embodiment, the solar cells are arranged on the housing to provide a window for radio frequency signals.

In some embodiments of the radio unit, the flexible, thin-film solar cells comprise organic polymer solar cells that are transparent to RF signals transmitted or received by the transceiver circuit.

Another aspect of the disclosure comprises methods for generating power for a radio unit having electronic circuits enclosed within a housing having seamlessly integrated solar cells. The method comprises converting solar energy (daylight) incident on the housing of the radio unit into electricity using thin-film solar cells integrated with the housing; and supplying power generated by the solar cells to an electrical device (e.g. electronic circuits or fans) in the radio unit. The amount of electricity that can be produced depends on the area of solar cells, direction that solar cells are facing, time of year and latitude.

In some embodiments of the method, supplying power generated by the solar cells to an electrical device in the radio unit comprises supplying power generated by the thin-film solar cells to the electronic circuits. In one embodiment, energy generated from the thin-film solar cells is used to charge an energy storage device, and the using energy stored in the energy storage device is used to power the electronic circuits.

In some embodiments of the method, supplying power generated by the solar cells to an electrical device in the radio unit comprises supplying power generated by the thin-film solar cells to one or more cooling fans. In one embodiment, energy generated from the thin-film solar cells is used to charge an energy storage device, and the using energy stored in the energy storage device is used to power the one or more cooling fans.

In some embodiments of the method, the radio unit comprises a heat sink having a plurality of fins and the method further comprises operating one or more cooling fans to generate an air flow across the plurality of fins of the heat sink.

In some embodiments, the method further comprises transmitting and receiving RF signals using one or more antennas enclosed within said housing. In one embodiment, the RF signals pass through a portion of the housing (e.g. a window) not covered by the thin-film solar cells. In another embodiment, the thin-film solar cells comprise organic polymer solar cells and the radio RF signals pass through the organic polymer solar cells. The radio unit as herein described uses solar cells to offset the energy drawn by the radio unit from the power grid. The energy may be used to power a transceiver circuit in the radio unit, or to power one or more cooling fans. Using solar cells to offset power drawn from the power grid reduces the operating cost of the radio unit and may, in some cases, provide for more efficient cooling of the radio unit, which results in fewer heat related malfunctions and longer life expectancy.

DETAILED DESCRIPTION

Figure 1B:
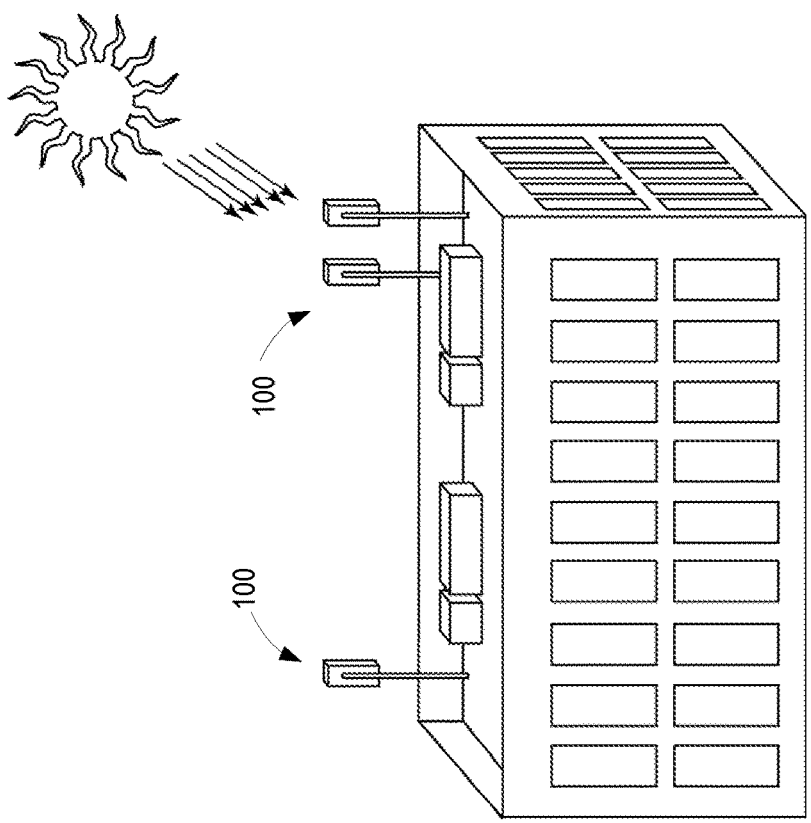
FIGS. 1A and 1B illustrate radio units mounted respectively on a radio tower and on a post on a roof top.
Figure 1A:
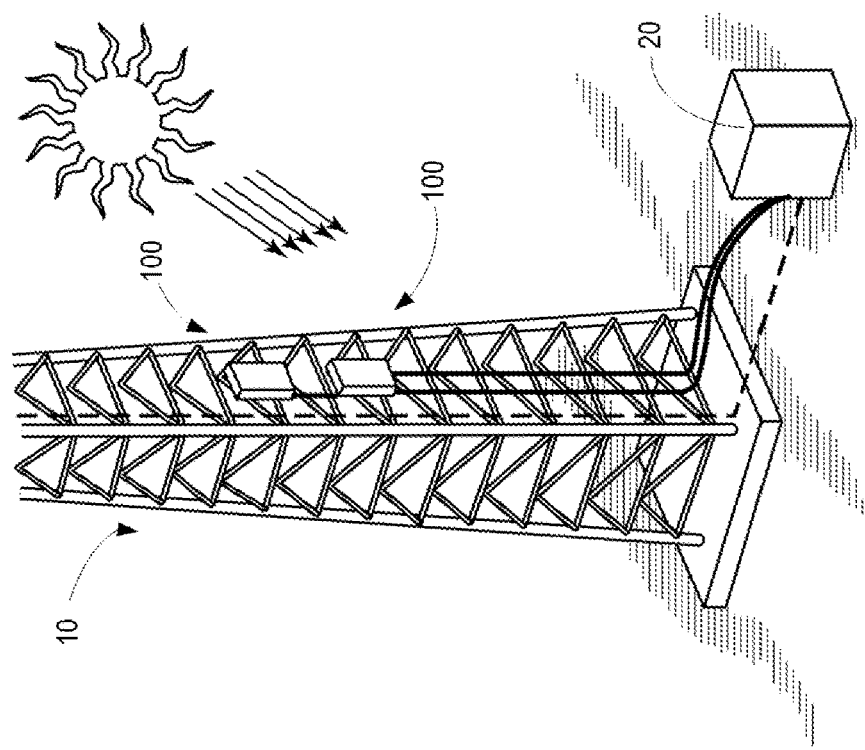

FIG. 1A illustrates a tower 10 in a cellular radio access network (RAN). A plurality of radio units 100 are mounted to the tower 10 and are connected by lines or cables to control unit 20 of a cellular base station. The radio unit 100 and control unit 20 collectively form a base station, which is also known as an Evolved Node B (eNB). In the upcoming Fifth Generation (5G) network, the base station is known as 5G Node B (gNB). FIG. 1B illustrates radio units 100 mounted on posts on the roof top of a building.

The radio unit 100, described in more detail below, contains electronic circuits for transmitting and receiving radio frequency signals. Each radio unit 100 couples to one or more antennas or antenna elements, which may be part of the radio unit 100 or may be physically separate from the radio unit 100. The electronic circuits include integrated digital and analog printed circuit boards (PSBs), for generating, transmitting and receiving radio frequency (RF) signals. The radio unit 100 as herein described is commonly known as a remote radio unit (RRU), a remote base transceiver station (BTS), an antenna integrated radio (AIR), or an active antenna system (AAS). The radio units 100 are exposed to ambient temperatures and solar radiation. Additionally, due to non-efficiency of high thermal flux components on the printed circuit boards (PCBs), such as RF power amplifiers, transceivers, and power converters, mounted, the radio units 100 generate a lot of heat that needs to be continuously removed. Temperature management is an important consideration in the design and operation of the radio units 100. The radio units 100 should be designed to operate for long periods of time without overheating or malfunctioning due to excessive temperature.

Conventional radio units 100 typically include a metal or plastic housing hardened for outdoor environments and painted with light color reflective paints to reflect solar radiation. Heat sinks can be provided to dissipate heat generated by the electronic circuits or absorbed by the housing to the ambient environment through natural convection. In some cases, cooling fans may be provided to cool the radio unit by forced convention. Power for the radio units is typically provided from a power grid. Battery backups may be provided for temporary power outages.

In the last two decades, there has been a lot of advancement in the field solar cell technology (photovoltaic cells made of various semiconductor compound based, e.g., on gallium arsenide, cadmium telluride, polymers, etc.) and ways to harvest the daylight in more efficient ways. A solar cell is an electrical device that converts light energy into electrical current and voltage by the photo-voltaic effect. New solar photovoltaic nano-material cells are light in weight, flexible, efficient in low light usage, and very thin in physical terms. These new solar cells are available at low cost with efficiency of up to 35%. Most recently, advancements have been made in developing organic solar sensitive materials. Many organic-based polymers (metal element-free organic dye-sensitized) solar cells with lower efficiency (up to 14% efficiency) are emerging as an alternative to photovoltaic devices.

Solar cells have not previously been used in outdoor radio units 100 for a number of reasons. First, the housings or enclosures for conventional radio units 100 are designed to minimize heat absorption. Solar cells, in contrast, are designed to absorb visible light while significant portions of invisible (to us) infrared light are absorbed as heat, and thus will increase the solar load on the radio unit 100. Secondly, the materials used in most solar cells interfere with radio frequency signals transmitted and/or received by the radio unit. These potential drawbacks are mitigated in embodiments of the present disclosure to enable integration of the solar cells into the housing or enclosure of the radio unit 100 for offsetting the energy consumption of the radio unit with the goal of reducing the carbon footprint of the radio unit 100. Once the efficiency of new solar cell materials increases, solar power could be the sole source of electricity for outdoor radio units used in wireless communication networks.

One aspect of the disclosure comprises methods and apparatus for offsetting the power consumption of the radio unit 100 and reducing the carbon footprint of the radio unit 100. In embodiments of the disclosure, thin-film solar cells are incorporated into the housing of the radio unit 100 to offset the energy consumption of the radio unit 100, i.e. to reduce the energy supplied to the radio unit 100 by the power grid. The energy generated from the solar cells may be used to power the electronic circuits in the radio unit 100, which will reduce the amount of power taken from the power grid and reduce operating costs for the radio unit 100. The energy generated from the solar cells may also offset power taken from the power grid and used for cooling the radio unit 100 during the peak sun hours in the diurnal cycle. In some embodiments, the energy generated by the solar cells may be used to power cooling fans for more efficient thermal management. The more efficient thermal management will, in turn, reduce failures in the radio unit due to excessive temperatures.

Figure 2:
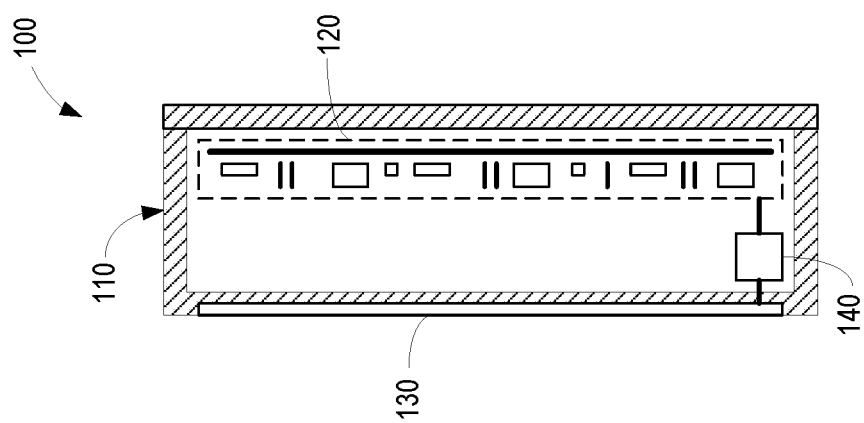
FIG. 2 illustrates an exemplary radio unit according to a first embodiment.

FIG. 2 illustrates a first exemplary radio unit 100 according to one embodiment. The radio unit 100 includes a housing 110, electronic circuits 120 disposed within the housing, one or more thin-film solar cells 130 affixed to the housing 110 and an auxiliary power circuit 140. The housing 110 may, for example, be of a clam shell design to provide easy access to the interior of the housing 110. The housing 110 may be made of metal or plastic. The housing 110 may be painted or coated with light color material to reflect solar radiation in areas not covered by the solar cells 130. Plastic materials with low thermal conductivity may be advantageous to prevent heating of the interior of the housing 110 due to solar radiation.

The electronic circuits 120 are disposed within the housing 110. The electronic circuits 120 comprise power converters, RF power amplifiers, RF transceivers, and other circuitry necessary to transmit and receive RF signals. The electronic circuits 120 may include several transceivers to enable the radio unit 100 to operate at multiple frequencies and/or to serve multiple user terminals in the cellular network. The transceiver circuit or circuits in the radio unit 100 couple to one or more external antennas or antenna elements (not shown in FIG. 2), which are physically separated from the radio unit 100.

The solar cells 130 are affixed or applied to the outer surface of the housing 110. The manner in which the solar cells 130 are affixed or applied to the housing 110 is not a material aspect of the disclosure. The solar cells 130 may be laminated to the housing 110 or adhered to the housing 110 by suitable adhesive materials. In some embodiments, an organic polymer film may be sprayed or deposited on the outer surface of the housing 110. In other embodiments, the solar cells 130 can be mounted in a frame that forms a part of the housing 110, or that is secured to the housing 110 by suitable fasteners (e.g. screw-type fasteners, rivets, etc.). If the housing 110 is made of plastic, the solar cells 130 can be molded into or co-molded with the housing 110. The solar cells 130 are preferably located on an area of the housing that is exposed to direct solar radiation to maximize the amount of electrical energy that is generated.

An auxiliary power circuit 140 couples the solar cells 130 to the electronic circuits 120 in the housing 110 so that energy generated by the solar cells 130 can be used to power the electronic circuits 120 and offset the power taken from the power grid. Exemplary embodiments of the auxiliary power circuit 140 are described in more detail below. Generally, the energy generated by the solar cells 130 may be used to directly power the electronic circuits 120, or indirectly power the electronic circuits 120 by charging a "solar" battery that stores power and supplies the power to the electronic circuits 120.

Figure 3:
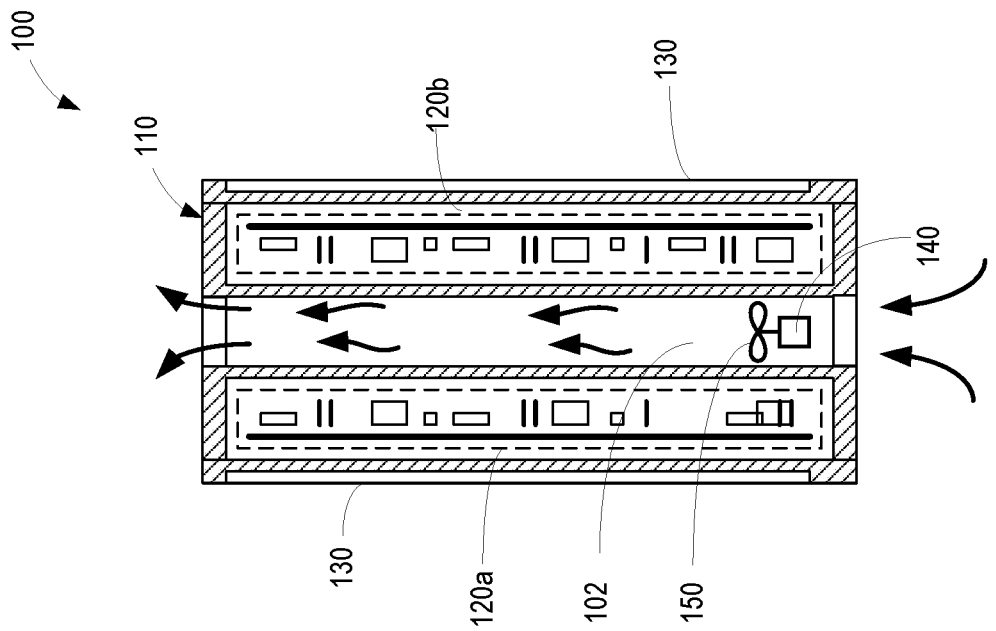
FIG. 3 illustrates an exemplary radio unit according to a second embodiment.

FIG. 3 shows another embodiment of the radio unit 100. For convenience, similar reference numbers in the figures are used to indicate similar components in the various embodiments. The radio unit 100 shown in FIG. 3 includes a housing 110, two electronic circuits 120a and 120b, separated by the inner channel 102, solar cells 130 and auxiliary power circuit 140 as previously described. In this embodiment, air flows through the inner channel 102 of the housing 110, which may include heat sinks with fins (not shown), to dissipate heat from the electronic circuits 120 inside the housing 110. The radio unit 100 further includes one or more fans 150 to create a forced air flow through the channel 102. Those skilled in the art will appreciate that, due to the outdoor environmental conditions, the PCB and the electronic circuits should not be exposed directly to air. Rather, the PCBs needs to be in a hardened enclosure where dust, dirt or rain cannot penetrate. The fans 150 may be configured to operate continuously, or intermittently. For example, the fans 150 may be configured to turn on and off with a predetermined duty factor. In another example, a controller (FIGS. 7 and 8) for the fans 150 may be configured to sense the temperature in the housing 110 and to actuate the fans 150 based on the sensed temperature. In this embodiment, the energy generated by the solar cells 130 powers the fans to offset the energy provided by the power grid. The solar cells 130 may power the fans 150 directly or indirectly by charging a battery that supplies the power to the fans 150.

Figure 4:
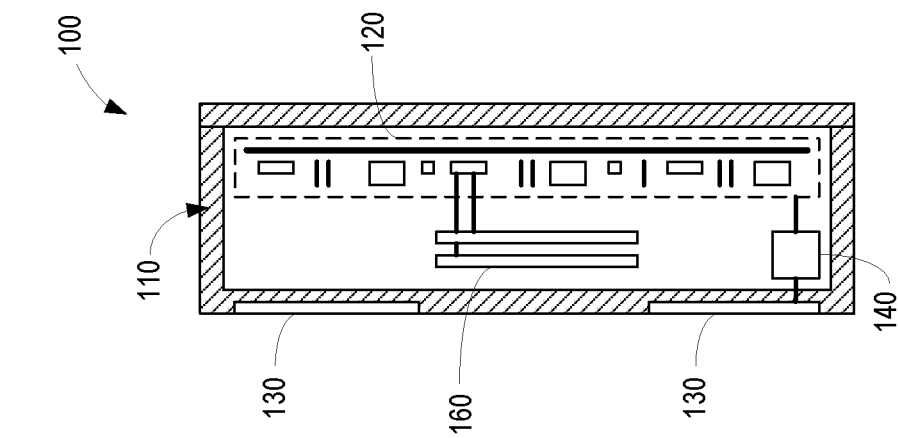
FIG. 4 illustrates an exemplary radio unit according to a third embodiment.

FIG. 4 shows another embodiment of the radio unit 100 that includes one or more antennas or antenna elements 160 within the housing 110. This embodiment includes a housing 110, electronic circuits 120, solar cells 130, and auxiliary power circuit 140 as previously described. The electronic circuits 120 couple to one or more antennas or antenna elements 160 which are contained within the housing 110. The solar cells 130 are arranged on the outer surface of the housing 110 so as to avoid blocking RF signals transmitted and received by the antennas 160. In this embodiment, the housing 110 is made of a material that is pervious to radio emissions. In some embodiments, the arrangement of the solar cells 130 on the housing forms a window (i.e., an uncovered area surrounded by solar cells 130) through which the radio emissions are transmitted or received.

If the organic polymer films are used as solar cells for generating electrical power, as they are transparent to RF signals, they can be used over the entire antenna surface in a radio unit 100. In that case there is no need to form a window through which the RF signals are transmitted or received.

Those skilled in the art will appreciate that the various features of the radio unit 100 shown in FIGS. 2, 3 and 4 can be combined. For example, the embodiments shown in FIGS. 2 and 4 can be modified to include one or more fans 150 as shown in FIG. 3. In this case, the auxiliary power circuit 140 can be configured to provide power to the electronic circuits 120 or fans 150 as needed. During periods when the temperature is low, the energy generated by the solar cells 130 can be used to power the electronic circuits 120. Conversely, when the temperature within the housing 110 is high, the energy generated by the solar cells 130 can be used to power the fans 150. As one example, a controller can be used to switch the power generated by the solar cells 130 between the electronic circuits 120 and fans 150 based on a temperature threshold. As one example, the controller may be configured to supply power to the fans 150 when the temperature rises above the threshold and to supply power to the electronic circuits 120 when the temperature falls below the threshold. In some embodiments, one threshold may be used to switch power from the electronic circuits 120 to the fans 150, and a different, lower threshold may be used to switch power from the fans 150 to the electronic circuits 120.

Figure 5:
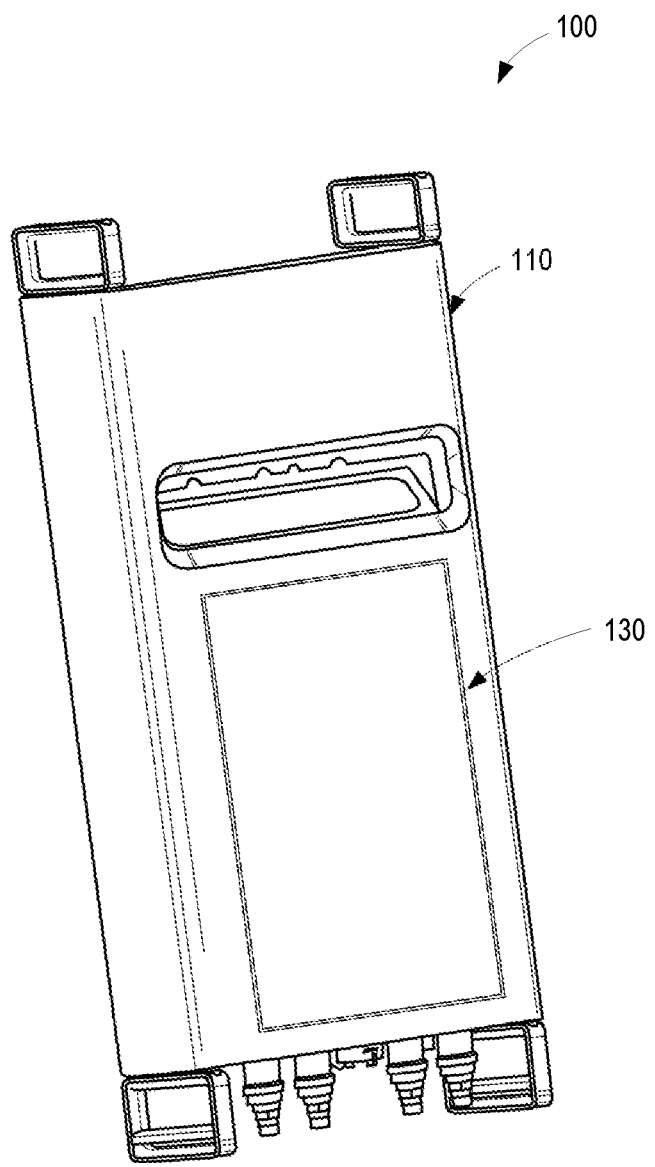
FIG. 5 is a perspective view of a radio unit with an integrated solar cell.

FIG. 5 illustrates the physical configuration of an exemplary radio unit 100 according to one embodiment. The housing 110 of the radio unit 100 has a generally rectangular form with connectors at one end for the power and antenna feeds. The solar cells 130 cover a substantial area on the front of the housing 110 below an air inlet. Those skilled in the art will appreciate that the size and placement of the solar cells 130 on the housing 110 can be selected based on factors such as the amount of energy production desired, exposure to solar radiation, orientation of the radio unit 100, and physical constraints of the housing 110 and contents.

The solar cells 130 may comprise conventional silicon-based solar cells or organic solar cells. Most conventional solar cells 130 are made of crystalline silicon such as polysilicon and monocrystalline silicon with single junction or multiple junction solar cells Organic solar cells are a type of solar cell that uses organic electronics made from conductive organic polymers and/or small organic molecules. The most common type of organic solar cells is organic polymer solar cells (metal element-free organic dyes). An advantage of organic polymer solar cells is that they are inexpensive to manufacture in large quantities and are flexible. Some organic polymer films are also transparent to RF radiation and therefore can be used for absorption of solar energy over RF antenna elements, which is advantageous for use in a radio unit 100.

Thin-film solar cells 130 can be made using both silicon-based materials and organic materials by depositing one or more thin layers of photovoltaic film or folia on a substrate, such as glass, plastic or metal. Film thickness may vary from a few nanometers to tens of micrometers. Materials used for thin-film solar cells include cadmium telluride, copper indium gallium selenide, and amorphous thin-film silicon. Currently, thin-film solar cells are less efficient than conventional crystalline silicon solar cells, but the thin-film technology is rapidly improving. The thin-film solar cells 130, however, are more easily applied or affixed to the housing 110 of the radio unit 100 and result in a much smaller form factor.

Figure 6:
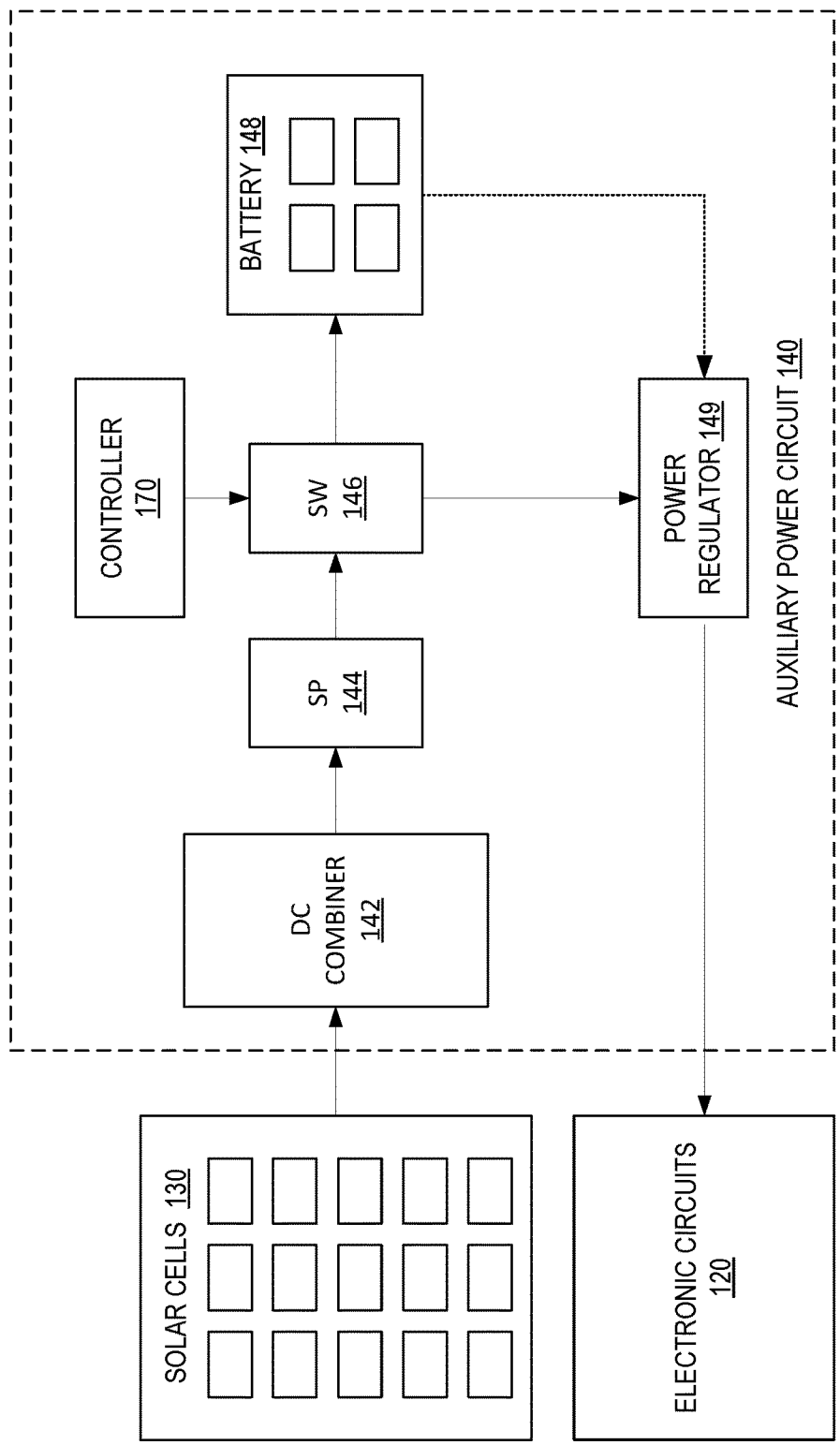
FIG. 6 illustrates a circuit for providing power generated by the solar cell to the electronic circuits in a radio unit.

FIG. 6 illustrates an exemplary power circuit 140 for supplying power to the electronic circuits 120 of the radio unit 100 from energy produced by the solar cells 130. The power circuit 140 comprises DC combiner 142, surge protector (SP) 144, switch (SVV) 146, and battery 148. The DC combiner 142 combines the outputs of multiple solar cells 130 into a DC output in the range of 12V to 24V. The output from the DC combiner 142 is provided to a surge protector 144 that protects the solar cells 130 from power surges. The switch 146 selectively connects the DC power generated by the solar cells 130 to either the electronic circuits 120 or battery 148. One output of the switch 146 connects to the battery 148 and the other output of the switch connects to a power regulator 149 supplying power to the electronics circuits 120. The switch 146 is controlled by a controller 170 that determines how the power generated by the solar cells 130 should be directed. As one example, the controller 170 may be configured to supply power directly to the electronic circuits 120 during periods of high power consumption to reduce the amount of power taken from the power grid, and to charge the battery 148 during periods of low power consumption. The decision to supply power directly to the electronic circuits 120 can be based in part on the level of power consumption and in part on the battery charge. For example, when power consumption is high and the battery charge is high, the electronic circuits 120 may be powered by the battery 148. As the battery charge is depleted, the controller 170 can switch off power from the battery 148 and supply power to the electronic circuits 120 directly from the solar cells 130. When energy consumption is low, the energy generated by the solar cells 130 may be used to recharge the batteries 148.

Figure 7:
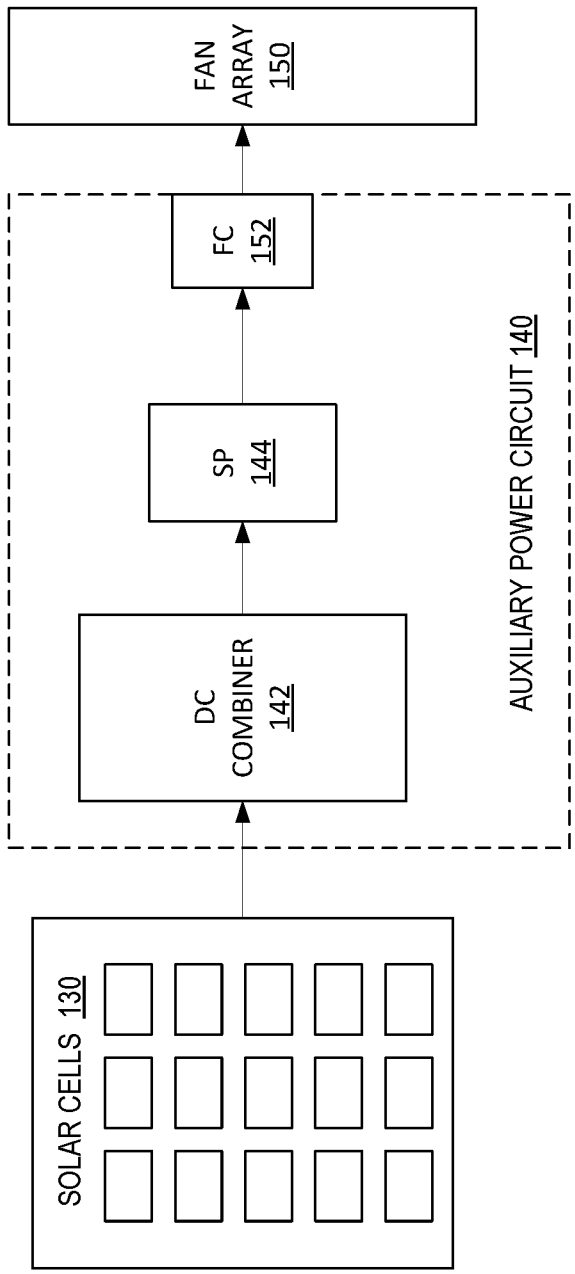
FIG. 7 illustrates a circuit for providing power generated by the solar cell to one or more fans for cooling the electronic circuits in a radio unit.

FIG. 7 illustrates an embodiment where the auxiliary power circuit 140 is used to supply power to one or more fans 150. In this embodiment, the power circuit 140 comprises a DC combiner 142 and surge protector (SP) 144 as previously described, and a fan connector (FC) 152 to connect the auxiliary power circuit 140 to the fans 150. Power generated by the solar cells 130 is applied directly to one or more fans 150. The fan connector 152 enables a plurality of fans 150 in a fan array to be connected to the auxiliary power circuit 140 in parallel.

Figure 8:
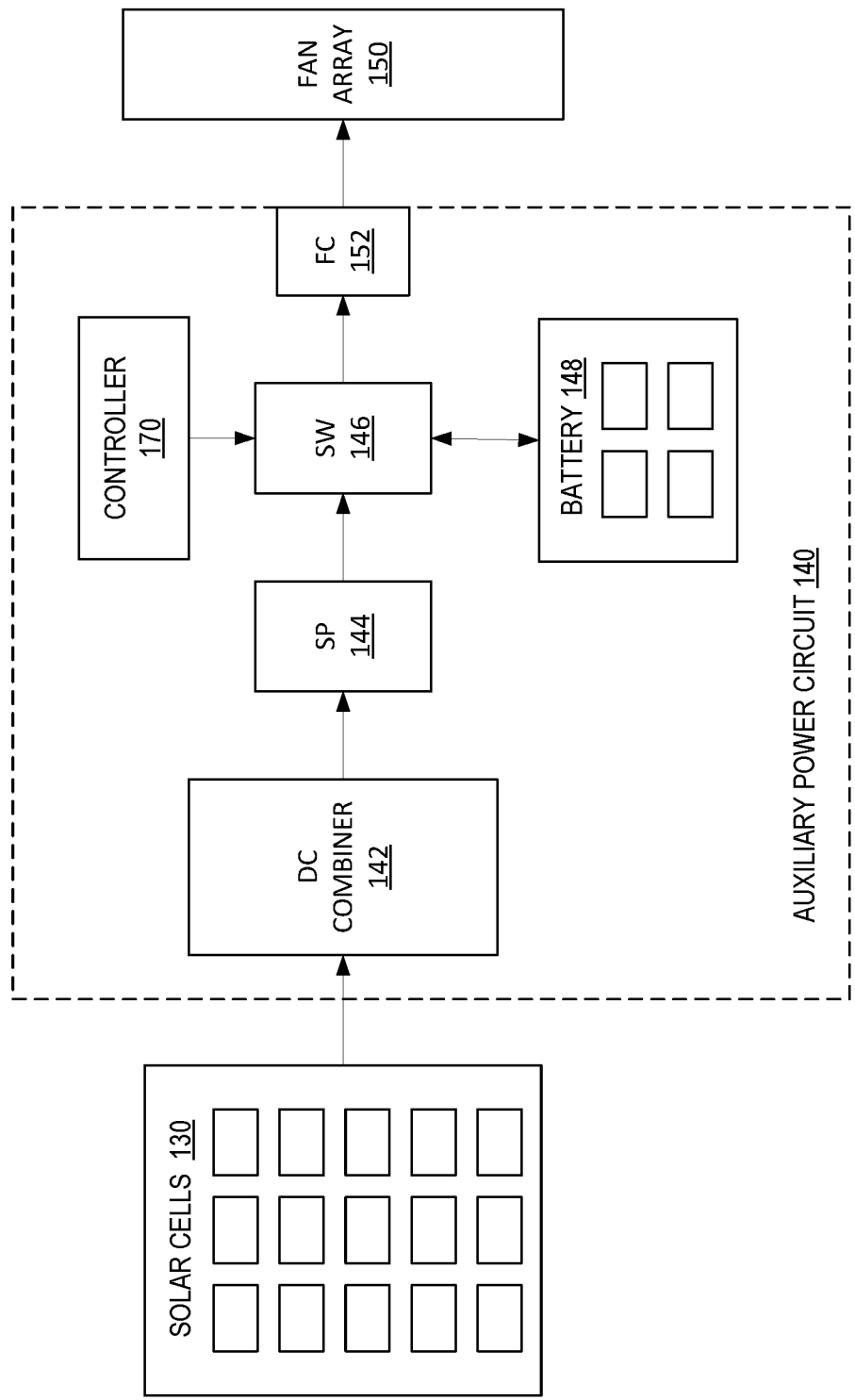
FIG. 8 illustrates another circuit for providing power generated by the solar cell to one or more fans for cooling the electronic circuits in a radio unit.

FIG. 8 illustrates another exemplary embodiment of the auxiliary power circuit 140. The auxiliary power circuit 140 includes a DC combiner 142, surge protector 144, switch 146, battery 148 and fan connector 152. In this case, one output of the switch 146 connects to the battery 148 and the other output of the switch connects to the fan connector 152. A controller 170 controls the switch 146 to direct power generated by the solar cells 130 to either the fans 150 or to the battery 148. For example, the controller 170 may be configured to provide power to the fans 150 during periods when the temperature is high, and to recharge the battery 148 when the temperature is low. In another embodiment, the fans 150 may be powered by the battery 148 and the solar cells can be used to recharge the battery 148 during daylight hours. The solar cells 130 can be sized to provide enough power during daylight to run the fans 150 for a 24 hour period.

Figure 9:
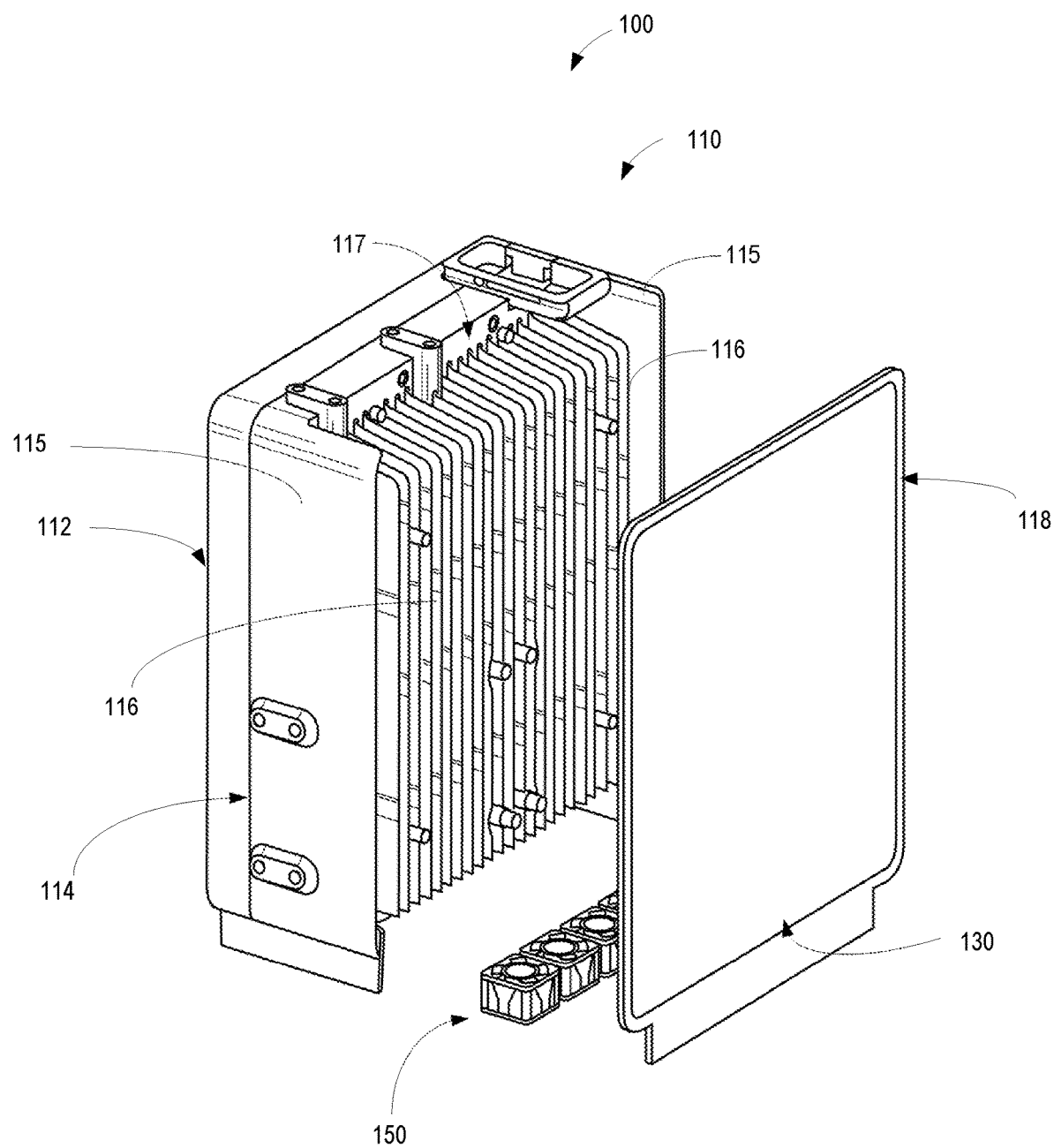
FIG. 9 is an exploded perspective view of a radio unit including heat sink, cooling fans, and cover panel with integrated solar cells.
Figure 10:
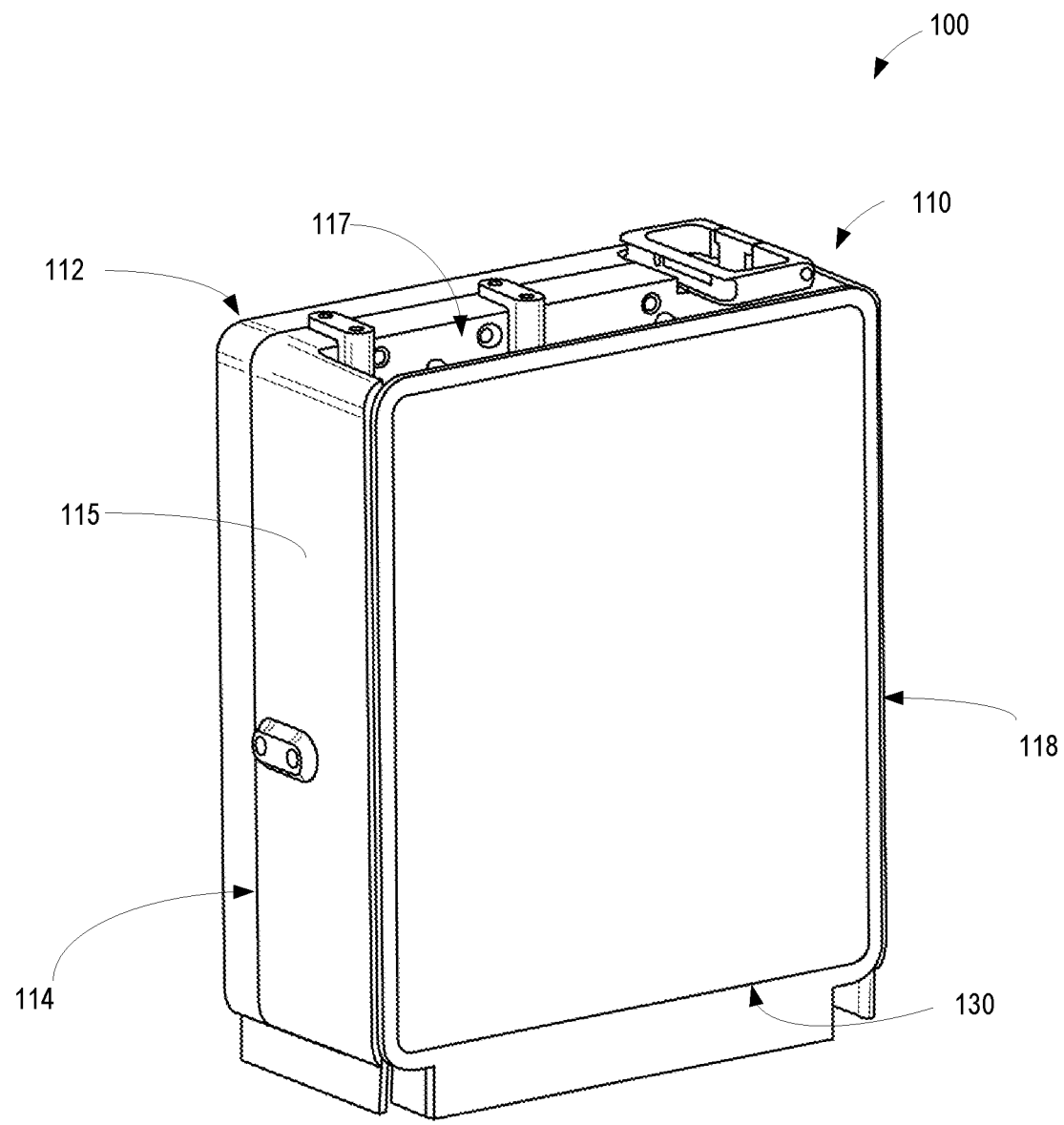
FIG. 10 is a perspective view of a radio unit shown in FIG. 9 with the components assembled.

FIGS. 9 and 10 illustrate an embodiment of the radio unit 100 where the housing 110 comprises three parts: a first housing section 112 that contains the electronic circuits 120, a second housing section 114 that serves as a heat sink, and a cover 118. The cover 118 may be offered as an optional add-on component. The first housing section 112 contains the electronic circuits 120 as previously described and possibly one or more antennas or antenna elements 160. The second housing section 114 includes opposing side walls 115, an open bottom, and an open top. The second housing section 114 serves as a heat sink including a plurality of fins 116. In this example, the fins 116 of the heat sink are vertically oriented. The cover 118 mounts to the second housing section 114 to enclose the fins 116 of the heat sink and form an air flow channel 117 extending vertically through the second housing section 114. Fans 150 are disposed in the opening at the lower end of the second housing section 114 and are attached to the cover 118. When operating, the fans 150 draw air into the lower end of the second housing section 114, which flows across the fins 116 and out through the opening at the top of the second housing section 114. The air flow across the fins 116 dissipates heat generated by the electronic circuits and by solar radiation. Using solar power for cooling is particularly useful in the solar insolation zones in the tropical zone (e.g., Caribbean and African tropical zones) where full sun hours (daylight hours) per day are extended.

The solar cover 118 with the integrated solar cells 130 and fans 150 can be offered as add-on solar cooling system and offered to customers as a standalone system. The add-on solar cover 118 may be considered as a field replaceable/addable unit (FRU) that is easy to attach before radio unit 100 is mounted on the pole or wall. The add-on cover 118 provide customers with a green product that uses solar, renewable energy, and has lead form factor. The customer will have the same number of steps, as it has today, as the solar shield array of fans will be stand-alone unit.

The add-on solar cover 118 provides improved thermal management allowing temperatures of the electronics to be reduced up to 8° to 10° C. The improved cooling will result in improved reliability and longer life expectancy for the radio unit 100.

The add-on solar cover 118 is particularly interesting for future products/sites (5G, etc.), where covers may be introduced on site level and cover multiple high frequency radio products. This option is especially interesting with advances of organic-based polymer (metal element-free organic dyes) that can be used for absorption of solar energy without interfering with RF antenna elements.

Figure 11:
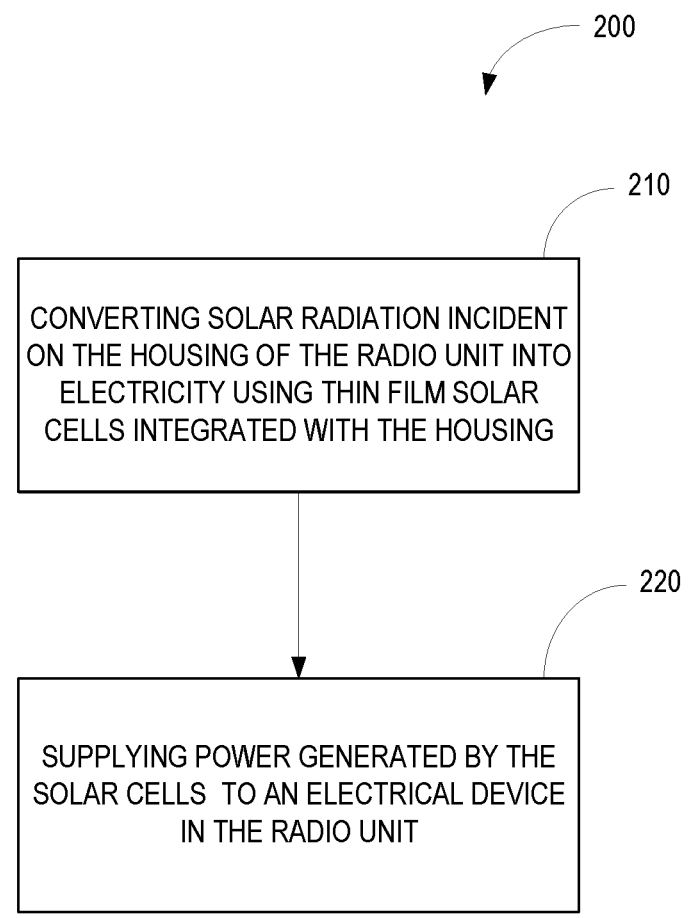
FIG. 11 illustrates an exemplary method implemented by a radio unit.

FIG. 11 illustrates an exemplary method 200 of generating power for a radio unit 100 in the cellular radio access network. The radio unit 100 includes a housing 110 and an electronic circuits 120 including a transceiver enclosed within the housing 110. During daylight hours, the enclosure or housing 110 will be exposed to daylight, not just sunlight. Solar cells 130 use the energy from daylight, as opposed to sunlight, to produce electricity so solar cells do not need direct sunlight to work. Of course the efficacy of harvesting renewable solar energy is increasing if the solar cells 130 are exposed to direct solar incident. The method includes converting solar radiation incident on the housing 110 of the radio unit 100 into electricity using thin-film solar cells 130 integrated with the housing 110 (block 210), and supplying power generated by the solar cells 130 to an electrical device (e.g. electronic circuits 120 or fans 150) in the radio unit 100 (block 220). In some embodiments, the power generated from the thin-film solar cells 130 is used to power the electronic circuits 120 for the radio unit 100. In other embodiments, the power generated from the thin-film solar cells 130 is used to power one or more fans 150 for cooling the radio unit 100.

In some embodiments, the power generated by the solar cells 130 is used to directly power the electronic circuits 120. In other embodiments, the power supplied by the thin-film solar cells 130 is used to indirectly power the electronic circuits 120 by charging a battery 148 that supplies power to the electronic circuits 120.

In some embodiments, the power generated by the solar cells 130 is used to directly power the one or more fans 150. In other embodiments, the power generated by the solar cells 130 is used to indirectly power the fans 150 by charging a battery 148 that supplies power to the fans 150.

In some embodiments, supplying power to the fans 150 comprises supplying power to the fans 150 when a monitored temperature reaches a predetermined threshold. In this case, the power to the fans 150 may be directed to the battery 148 when the temperature falls below the predetermined threshold.

In some embodiments, supplying power to the electronic circuits 120 comprises supplying power to the electronic circuits 120 when the power consumption of the electronic circuit or load is high. In this case, the power generated by the solar cells 130 can be directed to the battery 148 for storage when the energy consumption or load of the electronic circuits 120 is low.

In some embodiments, the method further comprises transmitting and receiving RF signals using one or more antennas or antenna elements 160 enclosed within the housing 110. The RF signals transmitted or received by the radio unit 100 may pass through a section of the housing 110 not covered by the thin-film solar cells 130. In one embodiment, the RF signals transmitted and received by the antennas or antenna elements 160 pass through a window formed by the solar cells 130. In other embodiments, the thin-film solar cells 130 comprise RF transparent organic polymer cells and the RF signals pass through the thin-film solar cells 130.

It is estimated that with current technology, the solar cells 130 can now provide up to 10% of the radio unit's power consumption. With future advances in solar cell technology, the solar cells 130 may provide a greater amount of the total power used or even replace power from the electrical grid for lower power, smaller outdoor radio units. The power generated by the solar cells 130 may be used as part of a thermal management system to manage the temperature within the housing 110 of the radio unit 100 and to offset power drawn from the power grid for cooling of the radio unit 100. Using power from the solar cells 130 to more effectively cool the radio unit 100 will prevent overheating or failures due to excessive heat, and extend the life expectancy of the radio unit 100.

The radio unit 100 as herein described uses solar cells to offset the energy drawn by the radio unit 100 from the power grid. The energy may be used to power a transceiver circuit in the radio unit 100, or to power one or more cooling fans 150. Using solar cells 130 to offset power drawn from the power grid reduces the operating cost of the radio unit 100 and may, in some cases, provide for more efficient cooling of the radio unit 100, which results in fewer heat related malfunctions and longer life expectancy. Also, with thin-film solar cells/folias 130, the form factor of the radio unit 100 can be kept small, which will be attractive to many customers.

Some of the embodiments contemplated herein are described with reference to the accompanying drawings. Other embodiments, however, are contained within the scope of the subject matter disclosed herein. The disclosed subject matter should not be construed as limited to only the embodiments set forth herein; rather, these embodiments are provided by way of example to convey the scope of the subject matter to those skilled in the art.

What is claimed is:

1. A remote radio unit for a cellular base station adapted for outdoor deployment, the remote radio unit comprising:
   electronic circuits including a cellular transceiver circuit;
   a remote radio unit housing enclosing the electronic circuits for mounting the remote radio unit in an outdoor location on a tower or support post where the remote radio unit is exposed to solar radiation, the remote radio unit housing including cable connectors to connect the remote radio unit to a remotely located control unit of the cellular base station;
   one or more antennas or antenna elements enclosed within the remote radio unit housing;
   one or more thin-film solar cells integrated with the remote radio unit housing to convert solar radiation into electrical energy; and
   wherein the solar cells are arranged on the remote radio unit housing to provide a window for radio frequency signals.

2. The remote radio unit of claim 1 further comprising:
   a heat sink having a plurality of fins for dissipating heat from the remote radio unit;
   one or more fans arranged to generate an air flow across the fins of the heat sink.

3. The remote radio unit of claim 2:
   wherein the remote radio unit housing comprises a cover configured to shield the heat sink from solar radiation and form an air flow channel; and
   wherein the solar cells are integrated with the cover.

4. The remote radio unit of claim 3, wherein the fans are attached to the cover.

5. A remote radio unit for a cellular base station adapted for outdoor deployment, the remote radio unit comprising:
   electronic circuits including a cellular transceiver circuit;
   a remote radio unit housing enclosing the electronic circuits for mounting the remote radio unit in an outdoor location on a tower or support post where the remote radio unit is exposed to solar radiation, the remote radio unit housing including cable connectors to connect the remote radio unit to a remotely located control unit of the cellular base station; and
   one or more antennas or antenna elements enclosed within the remote radio unit housing;
   one or more flexible, thin-film solar cells integrated with the remote radio unit housing to convert solar radiation into electrical energy; and
   wherein the flexible, thin-film solar cells comprise organic polymer solar cells that are transparent to RF signals transmitted or received by the transceiver circuit.

6. The remote radio unit of claim 5 further comprising:
   a heat sink having a plurality of fins for dissipating heat from the remote radio unit;
   one or more fans arranged to generate an air flow across the fins of the heat sink.

7. The remote radio unit of claim 6:
   wherein the remote radio unit housing comprises a cover configured to shield the heat sink from solar radiation and form an air flow channel; and
   wherein the solar cells are integrated with the cover.

8. The remote radio unit of claim 7, wherein the fans are attached to the cover.

9. A remote radio unit for a cellular base station adapted for outdoor deployment, the remote radio unit comprising:
   electronic circuits including a cellular transceiver circuit;

a remote radio unit housing enclosing the electronic circuits for mounting the remote radio unit in an outdoor location on a tower or support post where the remote radio unit is exposed to solar radiation, the remote radio unit housing including cable connectors to connect the remote radio unit to a remotely located control unit of the cellular base station; and one or more flexible, thin-film solar cells integrated with the remote radio unit housing to convert solar radiation into electrical energy;

a power circuit configured to power the electronic circuit using direct solar energy generated by the flexible, thin-film solar cells, wherein the power circuit includes a battery for storing energy generated by the flexible, thin-film solar cells;

wherein the energy stored by the battery is used to power the electronic circuits; and wherein the power circuit includes a controller configured to supply power directly to the electronic circuit or to the battery depending on power consumption of the remote radio unit.

10. A remote radio unit for a cellular base station adapted for outdoor deployment, the remote radio unit comprising:

electronic circuits including a cellular transceiver circuit;

a remote radio unit housing enclosing the electronic circuits for mounting the remote radio unit in an outdoor location on a tower or support post where the remote radio unit is exposed to solar radiation, the remote radio unit housing including cable connectors to connect the remote radio unit to a remotely located control unit of the cellular base station;

one or more flexible, thin-film solar cells integrated with the remote radio unit housing to convert solar radiation into electrical energy;

one or more fans configured to generate an air flow to provide forced convective cooling of the remote radio unit;

a power circuit configured to supply power to the one or more fans, wherein the power circuit includes a battery for storing energy generated by the flexible, thin-film solar cells;

wherein the energy stored by the battery is used to power the one or more fans; and wherein the power circuit includes a controller configured to supply power directly to the electronic circuit or to the battery depending on power consumption of the remote radio unit.

11. The remote radio unit of claim 7, further comprising:

a heat sink having a plurality of fins for dissipating heat from the remote radio unit;

one or more fans arranged to generate an air flow across the fins of the heat sink.

12. The remote radio unit of claim 8:

wherein the remote radio unit housing comprises a cover configured to shield the heat sink from solar radiation and form an air flow channel; and wherein the solar cells are integrated with the cover.

13. The remote radio unit of claim 12, wherein the fans are attached to the cover.

* * * * *